(12) United States Patent
Handt et al.

(10) Patent No.: US 12,184,269 B2
(45) Date of Patent: Dec. 31, 2024

(54) ELECTRONIC SWITCH WITH SURGE PROTECTOR

(71) Applicant: Siemens Aktiengesellschaft, Munich (DE)

(72) Inventors: Karsten Handt, Berg (DE); Stefan Hänsel, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 593 days.

(21) Appl. No.: 17/294,293

(22) PCT Filed: Oct. 28, 2019

(86) PCT No.: PCT/EP2019/079330
§ 371 (c)(1),
(2) Date: May 14, 2021

(87) PCT Pub. No.: WO2020/099103
PCT Pub. Date: May 22, 2020

(65) Prior Publication Data
US 2022/0014185 A1    Jan. 13, 2022

(30) Foreign Application Priority Data
Nov. 15, 2018   (EP) .................... 18206463

(51) Int. Cl.
*H03K 17/0814* (2006.01)
*H02H 3/087* (2006.01)
(52) U.S. Cl.
CPC ....... *H03K 17/08148* (2013.01); *H02H 3/087* (2013.01)

(58) Field of Classification Search
None
See application file for complete search history.

(56) References Cited

U.S. PATENT DOCUMENTS

| | | | |
|---|---|---|---|
| 4,750,100 A | 6/1988 | Ragsdale | |
| 5,233,495 A * | 8/1993 | De Palma | H03K 17/08144 361/13 |
| 5,384,528 A * | 1/1995 | Leowald | H02H 7/16 363/54 |

(Continued)

FOREIGN PATENT DOCUMENTS

| | | |
|---|---|---|
| CN | 101393818 A | 3/2009 |
| CN | 102754346 A | 10/2012 |

(Continued)

OTHER PUBLICATIONS

PCT International Search Report and Written Opinion of International Searching Authority mailed Feb. 17, 2020 corresponding to PCT International Application No. PCT/EP2019/079330 filed Oct. 28, 2019.

*Primary Examiner* — Yusef A Ahmed
(74) *Attorney, Agent, or Firm* — Henry M. Feiereisen LLC (57) ABSTRACT

An electronic switch includes a turn-off semiconductor switch, a capacitor, a varistor, with the capacitor and the varistor being arranged in a first series circuit which is arranged in parallel with the turn-off semiconductor switch, a switch, and a resistor, with the switch and the resistor being arranged in parallel with the turn-off semiconductor switch and with the first series circuit.

14 Claims, 4 Drawing Sheets

(56) References Cited

U.S. PATENT DOCUMENTS

| | | | | |
|---|---|---|---|---|
| 5,392,184 | A * | 2/1995 | Unterlass | H02J 3/1807 361/15 |
| 5,463,307 | A * | 10/1995 | Rosenberg | G05F 1/66 323/237 |
| 5,517,378 | A * | 5/1996 | Asplund | H01H 33/596 361/4 |
| 5,532,635 | A * | 7/1996 | Watrous | H02H 9/042 327/434 |
| 5,847,915 | A * | 12/1998 | Tranchand | H02H 3/087 361/111 |
| 9,948,089 | B2 * | 4/2018 | Horinouchi | H01H 9/547 |
| 10,447,024 | B2 * | 10/2019 | Sim | H01H 9/54 |
| 11,070,045 | B1 * | 7/2021 | Li | H02H 3/207 |
| 11,362,512 | B2 * | 6/2022 | Schierling | H01B 3/002 |
| 2003/0183838 | A1 * | 10/2003 | Huang | H03K 17/08148 257/107 |
| 2012/0188675 | A1 * | 7/2012 | Oppermann | H01F 7/1811 361/91.5 |
| 2012/0218676 | A1 * | 8/2012 | Demetriades | H01H 9/542 361/115 |
| 2012/0306264 | A1 * | 12/2012 | Komma | H03K 17/0814 307/9.1 |
| 2013/0009491 | A1 * | 1/2013 | Hafner | H03K 17/785 307/113 |
| 2013/0020881 | A1 * | 1/2013 | Panousis | H01H 33/596 307/113 |
| 2013/0043538 | A1 * | 2/2013 | Lu | H01L 27/088 257/E27.062 |
| 2014/0015592 | A1 * | 1/2014 | Weis | H03K 17/102 327/434 |
| 2015/0002977 | A1 * | 1/2015 | Dupraz | H01H 9/542 361/115 |
| 2015/0022928 | A1 * | 1/2015 | Mohaddes Khorassani | H02H 3/08 361/93.7 |
| 2015/0092459 | A1 * | 4/2015 | Bergdahl | H02J 3/01 363/39 |
| 2015/0131189 | A1 | 5/2015 | Davidson et al. | |
| 2015/0229121 | A1 * | 8/2015 | Davidson | H02H 9/043 361/54 |
| 2015/0236498 | A1 * | 8/2015 | Davidson | H03K 17/74 361/57 |
| 2015/0239363 | A1 * | 8/2015 | Brockerhoff | H02M 7/797 320/164 |
| 2016/0204596 | A1 * | 7/2016 | Horinouchi | H02H 3/38 361/101 |
| 2016/0285250 | A1 * | 9/2016 | Lee | H01H 9/54 |
| 2016/0300671 | A1 * | 10/2016 | Ergin | H01H 9/548 |
| 2016/0322178 | A1 * | 11/2016 | Park | H01H 33/596 |
| 2017/0011875 | A1 * | 1/2017 | Dorn | H01H 33/596 |
| 2017/0346384 | A1 * | 11/2017 | Davidson | H02M 5/45 |
| 2018/0183231 | A1 * | 6/2018 | Xie | H03K 17/08116 |
| 2019/0013662 | A1 * | 1/2019 | Norrga | H01H 33/59 |
| 2019/0057825 | A1 * | 2/2019 | Rupp | H01H 9/542 |
| 2019/0229529 | A1 * | 7/2019 | Askan | H02H 1/0007 |
| 2020/0014190 | A1 * | 1/2020 | Wen | H01H 9/547 |
| 2020/0136604 | A1 | 4/2020 | Schierling et al. | |
| 2020/0152407 | A1 * | 5/2020 | Askan | H01H 9/542 |
| 2021/0091561 | A1 * | 3/2021 | Schierling | H02H 3/20 |
| 2021/0135664 | A1 * | 5/2021 | Rupp | H03K 17/162 |
| 2021/0218387 | A1 * | 7/2021 | Krishnan | H03K 17/73 |
| 2021/0297073 | A1 * | 9/2021 | Rupp | H03K 17/08148 |
| 2021/0305980 | A1 * | 9/2021 | Sim | H02H 3/087 |
| 2022/0014164 | A1 * | 1/2022 | Hou | H02M 1/44 |
| 2022/0045507 | A1 * | 2/2022 | Rupp | H03K 17/56 |
| 2022/0149613 | A1 * | 5/2022 | Hänsel | H03K 17/102 |
| 2022/0149615 | A1 * | 5/2022 | Song | H01C 7/12 |
| 2022/0182051 | A1 * | 6/2022 | Handt | G01R 27/2611 |
| 2023/0253170 | A1 * | 8/2023 | Handt | H02H 9/04 361/1 |

FOREIGN PATENT DOCUMENTS

| | | |
|---|---|---|
| CN | 104272416 A | 1/2015 |
| CN | 205791504 U | 12/2016 |
| CN | 106300291 A | 1/2017 |
| CN | 106329899 A | 1/2017 |
| CN | 107005146 A | 8/2017 |
| DE | 37 18 941 A1 | 2/1988 |
| EP | 3 367 567 A1 | 8/2018 |
| WO | WO 2018-172134 A1 | 9/2018 |
| WO | WO 2019-011642 A1 | 1/2019 |

* cited by examiner

ELECTRONIC SWITCH WITH SURGE PROTECTOR

CROSS-REFERENCES TO RELATED APPLICATIONS

This application is the U.S. National Stage of International Application No. PCT/EP2019/079330, filed Oct. 28, 2019, which designated the United States and has been published as International Publication No. WO 2020/099103 A1 and which claims the priority of European Patent Application, Serial No. 18206463.4, filed Nov. 15, 2018, pursuant to 36 U.S.C. 119 (a)-(d).

BACKGROUND OF THE INVENTION

The invention relates to an electronic switch, having at least one turn-off semiconductor switch, wherein the electronic switch has a capacitor and a varistor, wherein the capacitor and the varistor are arranged in a first series circuit, wherein the first series circuit composed of the capacitor and the varistor is arranged in parallel with the turn-off semiconductor switch. The invention further relates to a method for operating such an electronic switch.

Nowadays, the supply of electrical energy takes place primarily via AC voltage networks. These have the advantage that different voltage levels can be produced with the aid of transformers. Owing to semiconductors, which are available on the market more and more cheaply, different voltage levels can also be easily generated for DC networks, so that the supply of energy via DC networks, in particular within industrial networks, also becomes particularly economical.

DC networks are intended here to reduce losses in future industrial systems, guarantee the direct exchange of energy between converters, storage systems and motors, and achieve increased robustness. For example, small DC networks with different cable lengths can in this case be operated between the various load outlets and infeeds. The short cable lengths lead to very low longitudinal inductances in the supply lines, such that fault currents can exhibit very steep increases in current. This requires very rapid fault detection and shut-down in the event of a fault. Mechanical switches often cannot meet these requirements. Therefore, what are known as electronic switches with semiconductor switches are being introduced. These are also known as solid state breakers. In contrast to mechanical switches, these switches are characterized by particularly rapid switching, typically in the order of magnitude of 100 ns.

DE 37 18 941 A1 discloses an apparatus for introducing high-voltage currents into a chemical solution. Said apparatus consists of a storage device, a recording device, a detection device and a guide device, which includes a high Joule switch.

EP 3 367 567 A1 discloses a switching apparatus for disconnecting a current path. Said document relates to a switching apparatus for disconnecting a current path of a DC voltage network comprising source-side and load-side inductance. The switching apparatus comprises at least two switching modules connected in series, wherein each of the switching modules comprises at least one controllable semiconductor switching element with which a series circuit composed of a resistor and a capacitor is connected in parallel.

WO 2018/172134 A1, which was published after the priority date, proposes a method for controlling a DC switch. The DC switch in this case has a first turn-off semiconductor switch and a second turn-off semiconductor switch, wherein the first and the second turn-off semiconductor switch are arranged between a first connection and a second connection in such a way that a current with a first polarity can be passed through the first turn-off semiconductor switch and the current with a polarity opposite to the first polarity can be passed through the second turn-off semiconductor switch, wherein one of the turn-off semiconductor switches is turned off depending on a measured current value.

WO 2019/011642 A1, which was published after the priority date, proposes an electronic switch having at least one turn-off semiconductor switch, a varistor and a capacitor. Here, the electronic switch has a first connection and a second connection, between which an electrically conductive connection can be made or broken by means of the at least one turn-off semiconductor switch on the basis of the switching state of the turn-off semiconductor switch. It is proposed here that a series circuit composed of the varistor and the capacitor is connected via a first diode to the first connection and via a second diode to the second connection in each case.

The invention is based on the object of improving an electronic switch, in particular with regard to the switching behavior thereof.

SUMMARY OF THE INVENTION

This object is achieved by an electronic switch, having at least one turn-off semiconductor switch, a capacitor and a varistor, wherein the capacitor and the varistor are arranged in a first series circuit, wherein the first series circuit composed of the capacitor and the varistor is arranged in parallel with the turn-off semiconductor switch, wherein the electronic switch has a switch and a resistor, wherein the switch and the resistor are arranged in a second series circuit, wherein the second series circuit composed of the switch and the resistor is arranged in parallel with the turn-off semiconductor switch and with the first series circuit. This object is also achieved by a method for operating such an electronic switch, wherein the switch is switched on before the turn-off semiconductor switch is switched on.

Further advantageous configurations of the invention are specified in the dependent claims.

The invention is based on the knowledge that the switching behavior of the electronic switch can be improved if a series circuit composed of a varistor and capacitor is arranged in parallel with the turn-off semiconductor switch. Said series circuit can protect the turn-off semiconductor switch from voltage peaks that occur during switching, and thus ensure fault-free operation and at the same time increase the service life thereof.

The turn-off power semiconductor switch can be a switch that can turn off a current only in one direction. This is particularly suitable for loads that are not capable of feedback and therefore also only carry current in one direction. It can also be a turn-off power semiconductor switch that can turn off a current in both directions.

The turn-off semiconductor switch is sensitive to voltage peaks that occur during switching, in particular during turn-off, of the current. Owing to the inductances present in the DC network, for example due to parasitic inductances in the cables, current changes, in particular current interruptions, lead to high voltages, some of which can then drop across the turn-off semiconductor switch and damage it or reduce the service life thereof. The turn-off semiconductor switch can be reliably protected from overvoltages and voltage peaks that occur by the first series circuit, composed of varistor and capacitor, arranged in parallel.

A transition from the off state to the on state of a switch is referred to here as switch-on and a transition from the on state to the off state of a switch is referred to as switch-off or turn-off.

Depending on its current-voltage characteristic curve, a portion of the voltage that occurs when the turn-off semiconductor switch is turned off drops across the varistor; the other part drops across the capacitor. A positive factor here is that the design of the varistor now becomes simpler, since it no longer has to take over the full reverse voltage. The energy from the inductances, both in the load and in the relevant branches of the DC network, is now also taken up by the capacitor. As a result, a voltage builds up in the capacitor, which is added to the voltage of the varistor. It is particularly helpful here that, when the load current drops, the capacitor voltage rises and compensates for the lower reverse voltage of the varistor. The load current decreases due to the applied reverse voltage of the capacitor according to the equation $u(t)=L*di/dt$ and, because of the behavior of the capacitor with $i(t)=C*du/dt$, a reverse voltage across the capacitor builds up more and more. In any case, a reverse voltage that is greater than the driving DC voltage is generated thereby, since the flow of current through the capacitor builds up a reverse voltage that inevitably and reliably prevents the flow of current after a certain time.

In other words, an energy of the inductance or inductances, which is located in the branch that is to be turned off or is turned off, is transferred from the inductance or inductances to the capacitor, the voltage of which increases as a result. When the turn-off semiconductor switch is switched off, voltage peaks occur due to the high change in current. These lead to the varistor breaking down and transitioning to the on state and allowing current to flow from the inductances to the capacitor. The voltage that is present at the capacitor and only builds up via the integral of the current flowing through it as well as the low voltage at the varistor, which has transitioned to the on state, is therefore also applied to the turn-off semiconductor switch, which is arranged in parallel with the first series circuit composed of varistor and capacitor. This means that the voltage at the turn-off semiconductor switch is also low and reliably protects it from voltage peaks. This ensures its functionality even when turning off high currents or high inductances in the relevant turned-off branch. In addition, the moderate voltages when the turn-off semiconductor switch is turned off increase the service life thereof.

If a short circuit occurs in a load in the DC voltage network, the DC source can be disconnected from the fault location by turning off the electronic switch. The current through the load inductances does not have a freewheeling path, as a result of which a voltage would build up across the turn-off semiconductor switch, which loads it or can even destroy it. The voltage limiting network in the form of the first series circuit composed of varistor and capacitor is in this case not only applicable to the electronic switch, shown schematically here, having turn-off semiconductor switches, but can also be used with any embodiment of DC switches in DC networks.

In this case, the electronic switch has a switch and a resistor, wherein the switch and the resistor are arranged in a second series circuit, wherein the second series circuit composed of the switch and the resistor is arranged in parallel with the turn-off semiconductor switch and with the first series circuit. By adding a switch and a resistor to the electronic switch, it can be switched on again with particularly low losses after a turn-off process. The energy from the inductances taken up by the capacitor during a turn-off process represents loading when the switch is switched on again, since this energy is suddenly discharged via the turn-off semiconductor switches when the electronic switch is switched on. The discharge current is given by the current/voltage characteristic curve of the varistor and can assume quite considerable values. This is particularly the case when there is only a short period of time between switching off and switching on again. In this short period of time, the capacitor can only discharge a little and lead the stored energy to loading of the turn-off semiconductor switches. The resistor is used to reduce this loading caused by the discharge currents. Switching the switch on will discharge the resistor. This happens when the voltage of the capacitor reaches a value above the trigger voltage of the varistor. The capacitor also does not need to be discharged below this trigger voltage either, since switching on via the turn-off semiconductor switches does not cause any discharge currents either.

In addition, the resistor can be used to precharge with moderate currents a load that causes a high inrush current. An example of such a load is a converter whose intermediate circuit capacitance causes a high charging current. Such loads are therefore mostly charged via a precharging resistor. When using the electronic switch with a switch and a resistor, said current limitation can be carried out by way of the resistor with the aid of the electronic switch. A separate precharging circuit can thus be dispensed with. A synergy arises because the switch-on of the switch takes place with particularly low loading using the resistor on the one hand and simultaneously the load offers the possibility of being connected to the DC voltage network with a current limit. This saves components and thus increases the reliability and the cost-efficiency of the DC energy supply, since such an arrangement can be produced particularly cost-effectively.

The switch can in this case be implemented cost-effectively as a mechanical switch, since the switching speed requirements are low. It is also possible, since a control unit for controlling semiconductor switches is already present, to also implement this with the aid of semiconductors. These can then also be designed to be anti-parallel or anti-series, depending on the embodiment of the semiconductor, such that they ensure that the capacitor is discharged regardless of the polarity of the voltage. If the electronic switch is only provided for turning off a current with one polarity, it is also sufficient for the switch to provide this only for one polarity, since the capacitor can only accept a voltage of one polarity.

The semiconductors can be turn-off semiconductors, such as IGBTs or MOSFETs, for example, or non-turn-off semiconductors, such as a thyristor, for example. Since the current through the switch and the resistor comes to a halt when the turn-off semiconductor switch of the electronic switch is switched on, the ability to turn off a current is not required for this application. The use of a thyristor is particularly advantageous here because the discharge currents or precharging currents from the load are temporarily high currents and the thyristor has a particularly high overload capacity. Overload capacity is understood to be the temporary loading of a current, which is permissible for a short time, but not permanently. This electronic switch can thus be produced particularly inexpensively, in particular when the switch is implemented using semiconductors or thyristors.

The switch is then advantageously switched on before the turn-off semiconductor switch or the turn-off semiconductor switches of the electronic switch is or are switched on again, such that at the time the turn-off semiconductor switch or the turn-off semiconductor switches is or are switched on, the voltage at the capacitor is sufficiently low or even zero. The discharge currents through the turn-off semiconductor switch or the turn-off semiconductor switches then no longer constitute high loading, with the result that the electronic switch has a longer service life.

In an advantageous configuration of the invention, the electronic switch has at least two turn-off semiconductor switches, wherein a first of the two turn-off semiconductor switches is arranged in such a way as to be able to turn off a current from a first connection of the electronic switch to a second connection of the electronic switch and a second of the two turn-off semiconductor switches is arranged in such a way as to be able to turn off a current from the second connection of the electronic switch to the first connection of the electronic switch, wherein the capacitor is designed as a bipolar capacitor. Turn-off semiconductor switches available on the market can usually only turn off a current in one direction. Typical representatives of such turn-off semiconductor switches are IGBTs or MOSFETs. If, when using such turn-off semiconductor switches, it is desired to be able to turn off currents in both directions by way of the switch, then two of these turn-off semiconductor switches are used. This means that both polarities of the current can be turned off by the electronic switch. The switches are arranged here in such a way that a current from a first connection of the electronic switch to a second connection of the electronic switch can be guided and turned off by a first of the two turn-off semiconductor switches and a current from the second connection of the electronic switch to the first connection of the electronic switch can be guided and turned off by a second of the two turn-off semiconductor switches. In the event that a diode is arranged in parallel with the switching element of the semiconductor switch, which diode makes the turn-off semiconductor switch reverse conductivity conductive, the two semiconductor switches are arranged in a series circuit. Since the switching elements of the two semiconductor switches each can carry a current of different polarity and turn it off, this series circuit is also referred to as anti-series. In this case, the two semiconductor switches are rotated with respect to the collector and emitter or drain and source terminals. In the event that the turn-off semiconductor switches are reverse non-conductive, the first and the second turn-off semiconductor switches are arranged in a parallel circuit, in which the first turn-off semiconductor switch can carry and turn off a current with a first polarity and the second turn-off semiconductor switch can carry and turn off a current with a different polarity. Such a parallel circuit s also referred to as an anti-parallel circuit or such an arrangement is referred to as anti-parallel.

By using these two turn-off semiconductor switches, a switch that can turn off currents with different polarities can be realized in a simple manner by using standard components.

In a further advantageous configuration of the invention, a discharge resistor is arranged in parallel with the capacitor. The discharge resistor ensures that a voltage across the capacitor is discharged continuously. In this way, the voltage arising at the capacitor can be reduced when the electronic switch is turned off. In this context, a deterministic discharge of the capacitor is discussed. If there is a sufficient period of time between the turn-off process and renewed switch-on process, which depends on the selection of the resistance value of the discharge resistor, the use of the switch with resistor can be dispensed with. Alternatively, it is possible to expand the circuit with switch and resistor to include this discharge resistor, such that the function of the electronic switch is available without restriction even for short periods of time between turning off and switching on again. Due to the discharge resistor, the loadings of the turn-off semiconductor switches and an existing switch are therefore further reduced, with the result that the service life of the switch is further increased in a simple manner.

In a further advantageous configuration of the invention, a further capacitor is arranged in parallel with the varistor. The further capacitor, whose capacitance value is advantageously at least one order of magnitude lower than the capacitance of the capacitor, compensates for the inductive response behavior of the off semiconductor switch or the turn-off semiconductor switches is commutated onto the first series circuit composed of varistor and capacitor. This, too, once again reduces the loading that arises at the turn-off semiconductor switch or the turn-off semiconductor switches, which is caused by the voltage applied there.

In a further advantageous configuration of the invention, a further discharge capacitor is arranged in parallel with the varistor. If, as a further advantageous configuration, a further discharge resistor, which has a significantly lower resistance value than the discharge resistor, is now arranged in parallel with the varistor, the voltage drop across the varistor is therefore further reduced significantly during normal operation, that is to say in the state where the electronic switch is open and also in the state where the electronic switch is closed. This increases the service life of the varistor, since its loading is significantly decreased during operation. In this case, the resistance value of the further discharge resistor is advantageously at least one order of magnitude lower than that of the discharge resistor.

In the state where the electronic switch is open, the voltage drop across the varistor is now determined by the voltage divider of the discharge resistor and further discharge resistor, such that the selection of the above-mentioned resistance value is particularly advantageous. In the state where the electronic switch is closed, the capacitor is discharged via the varistor and the further discharge resistor. This offers the possibility of dispensing with the first series circuit and nevertheless enabling a rapid reconnection after a turn-off process without placing unacceptably high loading on the turn-off semiconductor switches. It is also possible to add the further discharge resistor to the electronic switch with an order of the first series circuit in order to further reduce the loadings during operation, in particular when the electronic switch is switched on again.

In a further advantageous configuration of the invention, the switch is switched off when a voltage at the capacitor falls below a voltage threshold value. If it is ensured that the loading resulting for the turn-off semiconductor switch or the turn-off semiconductor switches is sufficiently low due to discharge currents of the capacitor, the discharging of the capacitor can be ended. This is the case when the voltage at the capacitor falls below a predeterminable voltage threshold value. This enables the capacitor to be switched on again quickly even if the capacitor is not yet fully discharged. Furthermore, the time in which the load is still connected to the DC source via the resistor is further reduced. Even if only currents with a low value can develop as a result of this, since these are limited by the resistor, it can be advantageous, especially when there is a load-side short circuit, to stop the flow of current between the DC source and load as quickly as possible and thus avoid possible damage.

BRIEF DESCRIPTION OF THE DRAWING

The invention is described and explained in more detail in the following text using the exemplary embodiments illustrated in the figures. In the figures.

DETAILED DESCRIPTION OF PREFERRED EMBODIMENTS

Figure 1:
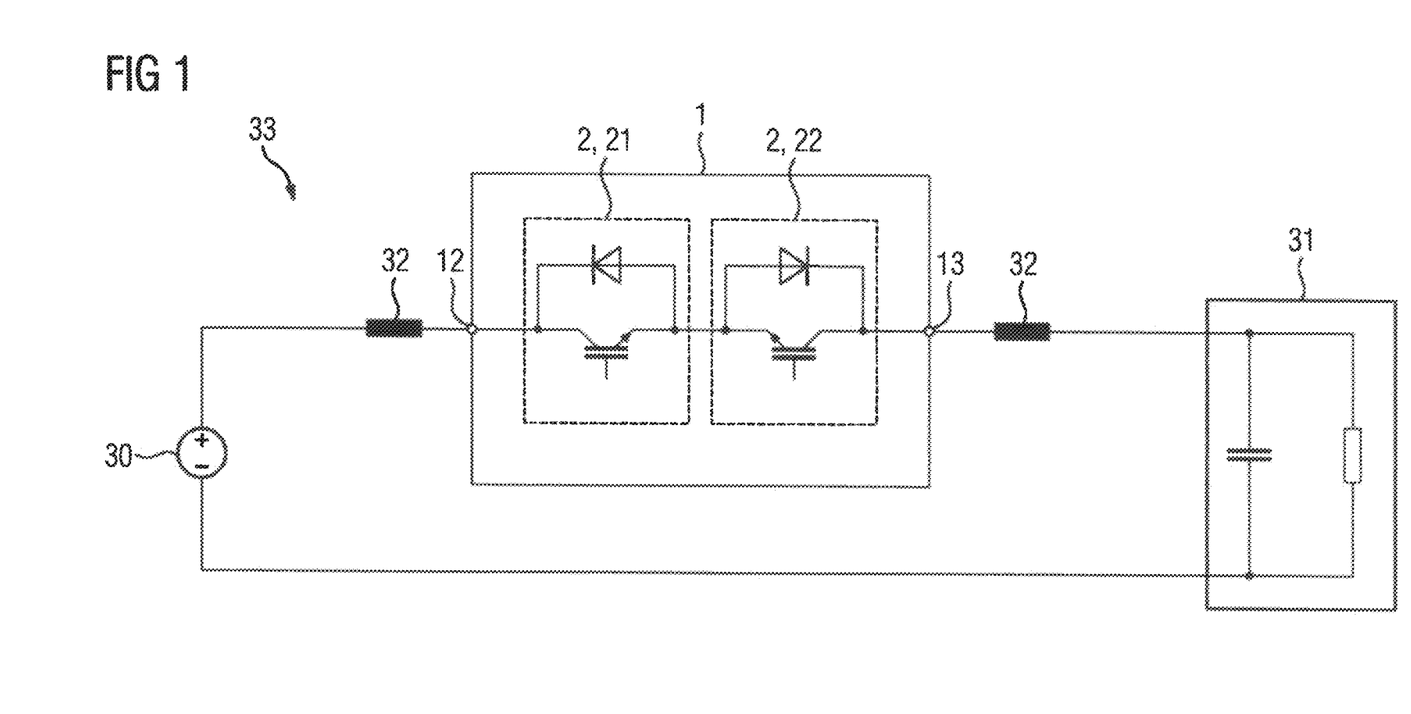
FIG. 1 shows a DC network with an electronic switch.

FIG. 1 shows a DC network 33, which is also referred to as a DC voltage network. Said network supplies power to a load 31 from a DC source 30, also referred to as a DC voltage source. This load may be, for example, a drive with a converter, wherein the converter with its intermediate circuit is connected to the DC source 30 via an electronic switch 1. The lines between DC source 30 and load 31 can assume very different properties with regard to their inductive behavior. This inductive behavior is illustrated in the illustration with the aid of inductances 32. These can take on very low values, as there is no transformer that has a current-limiting effect with its inductance. On the other hand, the inductances can also assume very high values due to the long cable lengths that are permissible due to the energy transfer with direct current. The requirements that result therefrom for the electronic switch are that, due to the low inductance and the associated large current changes, especially in the event of a short circuit, it should have a very rapid switching behavior so that impermissibly high currents, such as those generated in the event of a short circuit, for example, can be safely controlled. Furthermore, the switch must also be able to function reliably in the case of high inductances. Then, although there is no problem with excessive current increases, the inductance causes high voltages, which result from the change in current during turn-off. These must also be safely managed and must not damage the electronic switch 1 and its components located in it.

FIG. 1 here shows the basic structure of an electronic switch 1. Arranged in its power path between its first connection 12 and its second connection 13 there is at least one turn-off semiconductor switch 2, which can turn off a current through the switch. Depending on the type of turn-off semiconductor switch 2, it can turn off a current in only one direction or in both directions between the first and the second connection 12, 13. It is advantageous to use two turn-off semiconductor switches 2, which can each switch off the current for one direction. If these are reverse blocking, they are arranged in an anti-parallel circuit. In the event that the turn-off power semiconductor switches are reverse conductive, which can be identified at the diode parallel to the switching element of the turn-off semiconductor switch 2, 21, 22, the arrangement, as shown in FIG. 1, takes place in a series circuit, in which the first turn-off semiconductor switch 21 and the second turn-off semiconductor switch 22 of the two turn-off semiconductor switches are connected to one another in anti-series.

Figure 2:
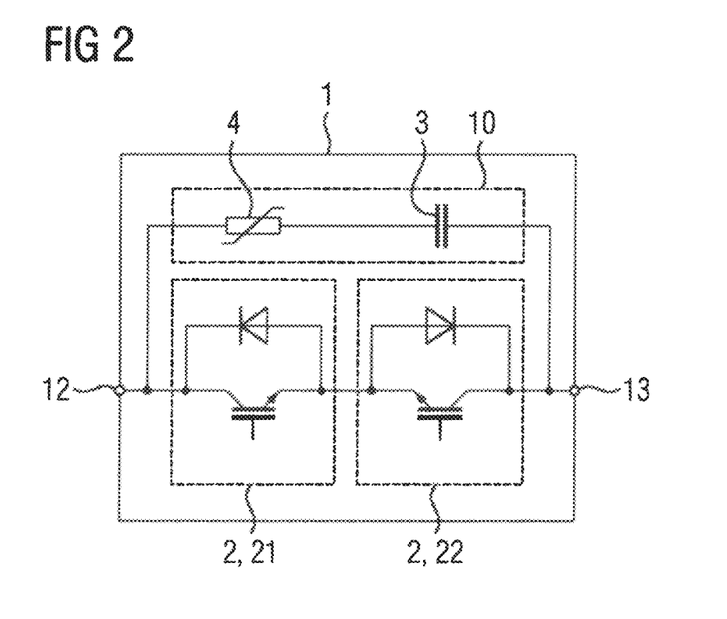
FIG. 2 to FIG. 4 show exemplary embodiments of an electronic switch with overvoltage protection.

FIG. 2 shows an exemplary embodiment of an electronic switch 1 with overvoltage protection. To avoid repetition, reference is made to the description relating to FIG. 1 and to the reference symbols introduced there. A first series circuit 10 is arranged in parallel with the first and second turn-off semiconductor switches 21, 22. This first series circuit 10 has a capacitor 3 and a varistor 4, which are arranged in a series circuit. If one of the two turn-off semiconductor switches 21, 22 turns off the current between the connections 12, 13 of the electronic switch 1, the current driven by the inductances is commutated onto the first series circuit 10. Because of the voltages that arise, the varistor becomes conductive, also referred to as the breakdown of the varistor, and the capacitor 3 absorbs the energy from the inductances. This reduces the voltages that arise at the switch, which result from the large decrease in current when the switch is turned off, and prevents damage to the switch. At the same time, the service life of the switch is increased, since the turn-off semiconductor switches are not loaded with excessively high voltage.

When the electronic switch 1 is switched on again, the capacitor 3 is discharged via the turn-off semiconductor switches 2, 21, 22. This is the case, in particular, when the period of time between turning off and switching on the electronic switch again is so short that self-discharge of the capacitor has not yet been able to take place or has not been able to take place sufficiently. In order to avoid this, in the exemplary embodiment of the electronic switch 1 in FIG. 3, a second series circuit 11 composed of switch 5 and resistor 6 is inserted, which is arranged in parallel with the first series circuit. To avoid repetition, reference is made to the description relating to FIGS. 1 and 2 and to the reference symbols introduced there. With this second series circuit 11, the capacitor 3 can be discharged by closing the switch 5 before the turn-off semiconductor switches 2, 21, 22 are switched on again. At the same time, this resistor 6 can be used as a precharging resistor for a load 31 which, due to high inrush currents, is usually connected to the DC source via a precharging resistor. An example of such a load is a converter whose intermediate circuit capacitor is usually charged via a precharging resistor.

Figure 3:
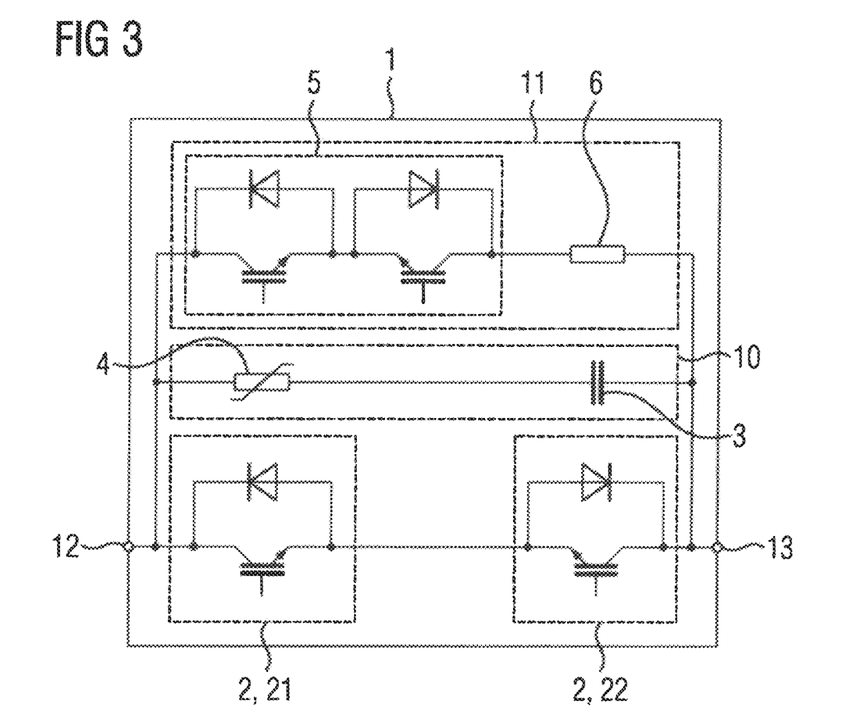

The switch can be realized in this case as a mechanical switch or with the aid of a semiconductor. Both turn-off semiconductors or else non-turn-off semiconductors, such as thyristors, can be used here.

Figure 4:
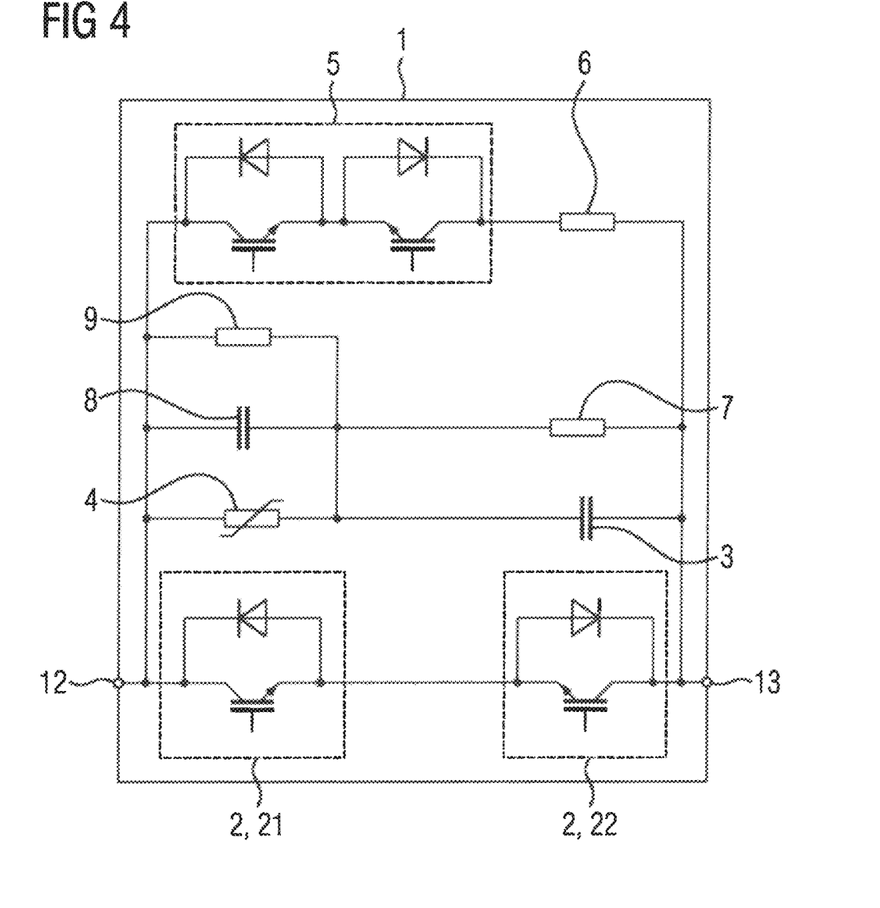

In the exemplary embodiment of FIG. 4, further measures for voltage limitation are shown, which can be used both individually or else in their entirety. To avoid repetition, reference is made to the description relating to FIGS. 1 to 3 and to the reference symbols introduced there. As a first measure, a discharge resistor 7 can be arranged in parallel with the capacitor 3. This ensures that after the electronic switch 1 has been turned off, the capacitor 3, which has absorbed the energy from the inductances 32, is quickly discharged again and that it can be switched on again without having to switch on the resistor 6 beforehand.

As a second measure, a further capacitor 8 is arranged in parallel with the varistor 4. This improves the inductive response behavior of the varistor 4 when the current is commutated from the turn-off semiconductor switches onto the current path through the capacitor 3. In this way, even short-term voltage peaks at the turn-off semiconductor switches can be avoided. This also has a positive effect on the service life of the electronic switch 1.

As a third measure, a further discharge resistor 9 can be arranged in parallel with the varistor 4. The voltage drop across the varistor 4 is reduced by the resulting voltage divider composed of the discharge resistor 7 and the further discharge resistor 9. This takes place both when the electronic switch 1 is switched on and when it is switched off and increases the service life of the varistor 4 and therefore also of the electronic switch 1. At the same time, the further discharge resistor 9 makes it possible for the capacitor 3 to be discharged moderately when the electronic switch 1 is switched on again. As a result, the second series circuit 11 can also be dispensed with. When used with the second series circuit 11, the voltage loading of the electronic switch 1 during switching can be further reduced and the service life thereof can be further increased as a result.

These three measures can be carried out separately or in any desired combination in order to improve the switching behavior of the electronic switch 1.

In summary, the invention relates to an electronic switch, having at least one turn-off semiconductor switch, wherein the electronic switch has a capacitor and a varistor, wherein the capacitor and the varistor are arranged in a first series circuit, wherein the first series circuit composed of the capacitor and the varistor is arranged in parallel with the turn-off semiconductor switch. To improve the electronic switch, in particular with respect to the switching behavior thereof, it is proposed that the electronic switch has a switch and a resistor, wherein the switch and the resistor are arranged in a second series circuit, wherein the second series circuit composed of the switch and the resistor is arranged in parallel with the turn-off semiconductor switch and with the first series circuit. The invention further relates to a method for operating such an electronic switch, wherein the switch is switched on before the turn-off semiconductor switch is switched on.

What is claimed is:

1. An electronic switch, comprising:
   a turn-off semiconductor switch, said turn-off semiconductor switch comprising a series connection of a first turn-off semiconductor switch and second turn-off semiconductor switch connected to one another in anti-series;
   a capacitor;
   a varistor, with the capacitor and the varistor being arranged in a first series circuit which is arranged in parallel with the turn-off semiconductor switch;
   a switch comprising a series connection of two semiconductor switches connected to one another in anti-series;
   a resistor, with the switch and the resistor being arranged in a second series circuit which is arranged in parallel with the turn-off semiconductor switch and with the first series circuit;
   a first discharge resistor arranged in parallel with the capacitor;
   a further capacitor arranged in parallel with the varistor; and
   a second discharge resistor arranged in parallel with the varistor, wherein the first and second discharge resistors form a voltage divider in order to reduce a voltage drop across the varistor.

2. The electronic switch of claim 1, with the first turn-off semiconductor switch being arranged such as to enable turning off a current from a first connection of the electronic switch to a second connection of the electronic switch, and with the second turn-off semiconductor switch being arranged such as to enable turning off a current from the second connection of the electronic switch to the first connection of the electronic switch, said capacitor being designed as a bipolar capacitor.

3. A method for operating the electronic switch as set forth in claim 1, said method comprising switching on the switch before the turn-off semiconductor switch is switched on.

4. The method of claim 3, further comprising switching off the switch when a voltage at the capacitor falls below a voltage threshold value.

5. The method of claim 3, further comprising:
   turning off a current from a first connection of the electronic switch to a second connection of the electronic switch by the first turn-off semiconductor switch; and turning off a current from the second connection of the electronic switch to the first connection of the electronic switch by the second turn-off semiconductor switch.

6. The method of claim 3, wherein the capacitor is designed as a bipolar capacitor.

7. An electronic switch, comprising:
   a turn-off semiconductor switch;
   a first capacitor;
   a varistor, with the first capacitor and the varistor being arranged in a first series circuit which is arranged in parallel with the turn-off semiconductor switch, the first series circuit further comprising a first discharge resistor and a second capacitor arranged in parallel with the varistor and a second discharge resistor arranged in parallel with the first capacitor, wherein the first and second discharge resistors form a voltage divider in order to reduce a voltage drop across the varistor;
   a switch comprising a series connection of two semiconductor switches connected to one another in anti-series, wherein the switch is switched off when a voltage at the first capacitor falls below a voltage threshold value; and
   a resistor, with the switch and the resistor being arranged in a second series circuit which is arranged in parallel with the turn-off semiconductor switch and with the first series circuit.

8. The electronic switch of claim 7, wherein the second discharge resistor is configured such that the first capacitor, which has absorbed energy from inductances external to the electronic switch after the electronic switch has been turned off, is discharged.

9. A method for operating the electronic switch as set forth in claim 7, said method comprising switching on the switch before the turn-off semiconductor switch is switched on.

10. An electronic switch, comprising:
    a turn-off semiconductor switch, said turn-off semiconductor switch comprising a series connection of a first turn-off semiconductor switch and second turn-off semiconductor switch connected to one another in anti-series;
    a capacitor;
    a varistor, with the capacitor and the varistor being arranged in a first series circuit which is arranged in parallel with the turn-off semiconductor switch;
    a switch comprising a series connection of two semiconductor switches connected to one another in anti-series;
    a resistor, with the switch and the resistor being arranged in a second series circuit which is arranged in parallel with the turn-off semiconductor switch and with the first series circuit;
    a first discharge resistor arranged in parallel with the capacitor;
    a further capacitor arranged in parallel with the varistor; and
    a second discharge resistor arranged in parallel with the varistor, wherein the switch is switched off when a voltage at the capacitor falls below a voltage threshold value.

11. The electronic switch of claim 10, with the first turn-off semiconductor switch being arranged such as to enable turning off a current from a first connection of the electronic switch to a second connection of the electronic switch, and with the second turn-off semiconductor switch being arranged such as to enable turning off a current from the second connection of the electronic switch to the first connection of the electronic switch, said capacitor being designed as a bipolar capacitor.

12. A method for operating the electronic switch as set forth in claim 10, said method comprising switching on the switch before the turn-off semiconductor switch is switched on.

13. The method of claim 12, further comprising:
turning off a current from a first connection of the electronic switch to a second connection of the electronic switch by the first turn-off semiconductor switch; and
turning off a current from the second connection of the electronic switch to the first connection of the electronic switch by the second turn-off semiconductor switch.

14. The method of claim 12, wherein the capacitor is designed as a bipolar capacitor.

* * * * *